United States Patent [19]

Jones et al.

[11] Patent Number: 5,254,210
[45] Date of Patent: Oct. 19, 1993

[54] METHOD AND APPARATUS FOR GROWING SEMICONDUCTOR HETEROSTRUCTURES

[75] Inventors: Kenneth A. Jones, Brick; Joseph R. Flemish, Westfield, both of N.J.; Alok Tripathi, Acton, Mass.; Vladimir S. Ban, Princeton, N.J.

[73] Assignee: The United States of America as represented by the Secretary of the Army, Washington, D.C.

[21] Appl. No.: 874,779

[22] Filed: Apr. 27, 1992

[51] Int. Cl.$^5$ ............................................. C23C 16/00
[52] U.S. Cl. .................................. 156/613; 118/715; 118/719; 118/725; 118/726
[58] Field of Search ............... 118/715, 719, 725, 726; 156/613

[56] References Cited

U.S. PATENT DOCUMENTS

| | | | |
|---|---|---|---|
| 4,664,743 | 5/1987 | Moss | 118/719 |
| 4,689,094 | 8/1987 | Van Rees | 156/613 |
| 4,808,551 | 2/1989 | Mori | 118/715 |
| 4,950,621 | 8/1990 | Irvine | 156/613 |
| 4,975,388 | 12/1990 | Guedon | 156/613 |

FOREIGN PATENT DOCUMENTS 64-83597  3/1989  Japan .................................. 156/613

OTHER PUBLICATIONS

Stringfellow, Organometallic Vapor-Phase Epitaxy: Theory and Practice, Academic Press, Boston ©1989, pp. 324–327.

Primary Examiner—Richard Bueker
Attorney, Agent, or Firm—Michael Zelenka; William H. Anderson

[57] ABSTRACT

A conventional hydride VPE reactor is modified by the addition of a gas switching manifold and the use of three way pneumatic valves in the manifold to alternately direct the flow of reactant gas mixtures into either the reactor or a vent line. With these additions, various predetermined gas mixtures of arsine, phosphine, and hydrogen selected by electronic mass flow controllers (GM1 and GM2) and predetermined gas mixtures of $H_2$ and HCl (GM3) may be alternately infused into the reactor chamber or vented as desired. When GM3 is injected into the reactor chamber, the content of GaAs of the growing layer increases while the content of In decreases. Given this, when GM3 and GM2 are vented rather than injected into the furnace and GM1 is directed into the furnace, a layer of InGaAsP with a predetermined composition (A) will be deposited. Alternatively, when GM3 and GM2 are co-injected into the reactor and GM1 is be directed to the vent, a layer of InGaAsP of a predetermined composition (B) will be deposited. Therefore, the flow rates of HCl, $PH_3$ and $AsH_3$ can be adjusted to produce compositions A and B that correspond to a lattice-matched condition with either InP or GaAs substrate.

20 Claims, 3 Drawing Sheets

METHOD AND APPARATUS FOR GROWING SEMICONDUCTOR HETEROSTRUCTURES

GOVERNMENT INTEREST

The invention described herein may be manufactured, used and licensed by or for the Government of the United States for governmental purposes without the payment to us of any royalties thereon.

FIELD OF THE INVENTION

This invention relates to the field of epitaxy techniques utilized in fabricating III-V semiconductor heterostructures and more particularly relates to modified hydride vapor phase epitaxy techniques.

BACKGROUND OF THE INVENTION

Considerable attention has been given to the use of $In_{1-x}Ga_xAs_{1-y}P_y$ in long wave emitters such as in DH lasers and detectors. Accordingly, it is well known that devices with improved performance can be fabricated from this material when thin layers or latticed matched layers with a continuously varying composition can be grown.

The methods most frequently used to obtain layers which are thin or of variable composition are molecular beam epitaxy (MBE) or organ metallic vapor phase epitaxy (OMVPE). These two methods are used primarily because low growth rates can be achieved and the nutrient flow can be altered abruptly. Growth rates as low as 02.5 m/h can be readily achieved by MBE simply by lowering the Knudsen cell temperatures while growth can be stopped abruptly with the cell shutter. However, in utilizing traditional MBE techniques, InGaAsP films are difficult to grow because the Arsenine (As)/Phosphorous (P) ratio is hard to control. Moreover, the high vapor pressure of Phosphorous can lead to Phosphorous contamination of the system.

With OMVPE, growth rates as low as 0.5 m/h are easily obtained using dilute gas mixtures while abrupt junctions are achieved by redirecting gas flows to the vent. However, as with MBE, it is also a challenge to grow InGaAsP layers because Phosphorous does not easily incorporate into the lattice and the nutrients can react before they reach the substrate.

Other methods have also been used to grow thin InGaAsP layers, but each has its own set of difficulties. The high growth rates and meltback of liquid phase epitaxy (LPE) make growing thin layers difficult and nonuniformity in the layer growth limits the size of the wafers that can be used. Further, traditional chloride vapor phase epitaxy (VPE) cannot be used because of the long time required for the cation and anion species to reach their steady state concentrations over the source boats. Furthermore, VPE has the additional disadvantage that the cation and anion concentrations cannot be separately controlled.

In contrast to chloride VPE, cation and anion concentrations maybe controlled separately in hydride VPE wherein the anion concentrations can be abruptly and/or continuously changed by varying the $AsH_3$ and $PH_3$ flow rates. However, with hydride VPE, control of the cation concentration is still limited by the long time transients between different steady state vapor concentrations.

To remedy some of these deficiencies, variations of the chloride and hydride VPE techniques have been attempted. Generally, these variations have utilized a double barrel reactor in which separate flows are maintained in two different zones and the substrate within the reactor is rapidly rotated between the two flows to grow the thin layers. Using this method, however, results in poor thickness uniformity and the limitation of only two preset compositions.

At present though, there is no method of epitaxially growing thin layers of InGaAsP by hydride VPE which allows the accurate modulation of the composition of InGaAsP alloys. The present invention addresses such a need.

SUMMARY OF THE INVENTION

Accordingly, it is an objective of the present invention to provide for an epitaxy method to grow layers of InGaAsP of varying compositions by a modified hydride VPE technique.

Specifically, it is an objective of the present invention to provide for such a technique wherein the composition of the InGaAsP film may be altered while at the same time retaining the lattice-match of the growth layers to an InP or GaAs substrate.

These and other objectives of the invention are obtained by simultaneously injecting hydrogen chloride gas (Hcl) and altering the $AsH_3/PH_3$ ratio flowing into a modified hydride VPE reactor. In the most generic embodiment of the invention, a conventional hydride VPE reactor is modified by the addition of a gas switching manifold and the use of three way pneumatic valves in the manifold to alternately direct the flow of reactant gas mixtures into either the reactor or a vent line. With these additions, various predetermined gas mixtures of arsine, phosphine, and hydrogen selected by electronic mass flow controllers (GM1 and GM2) and a mixture of $H_2$ and HCl (GM3) may be alternately infused into the reactor chamber or vented as desired. When GM3 is injected into the reactor chamber, the content of GaAs of the growing layer increases while the content of In decreases. Given this, when GM3 and GM2 are vented rather than injected into the furnace and GM1 is directed into the furnace, a layer of InGaAsP with a predetermined composition (A) will be deposited. Alternatively, when GM3 and GM2 are co-injected into the reactor and GM1 is be directed to the vent, a layer of InGaAsP of a predetermined composition (B) will be deposited. Therefore, the flow rates of HCl, $PH_3$ and $AsH_3$ can be adjusted to produce compositions A and B that correspond to a lattice-matched condition with either InP or GaAs substrate.

In an alternate embodiment of the invention, a further gas mixture of dopants GM4 can be entered in the reactor. Moreover, a perforated baffle may also be incorporated into the design of the reactor to improve the switching speed for more abrupt transitions between layer compositions.

BRIEF DESCRIPTION OF THE DRAWINGS

These and other features of the invention will be better understood in light of the foregoing Detailed Description of the Invention and the figures wherein.

DETAILED DESCRIPTION OF THE INVENTION

Figure 1:
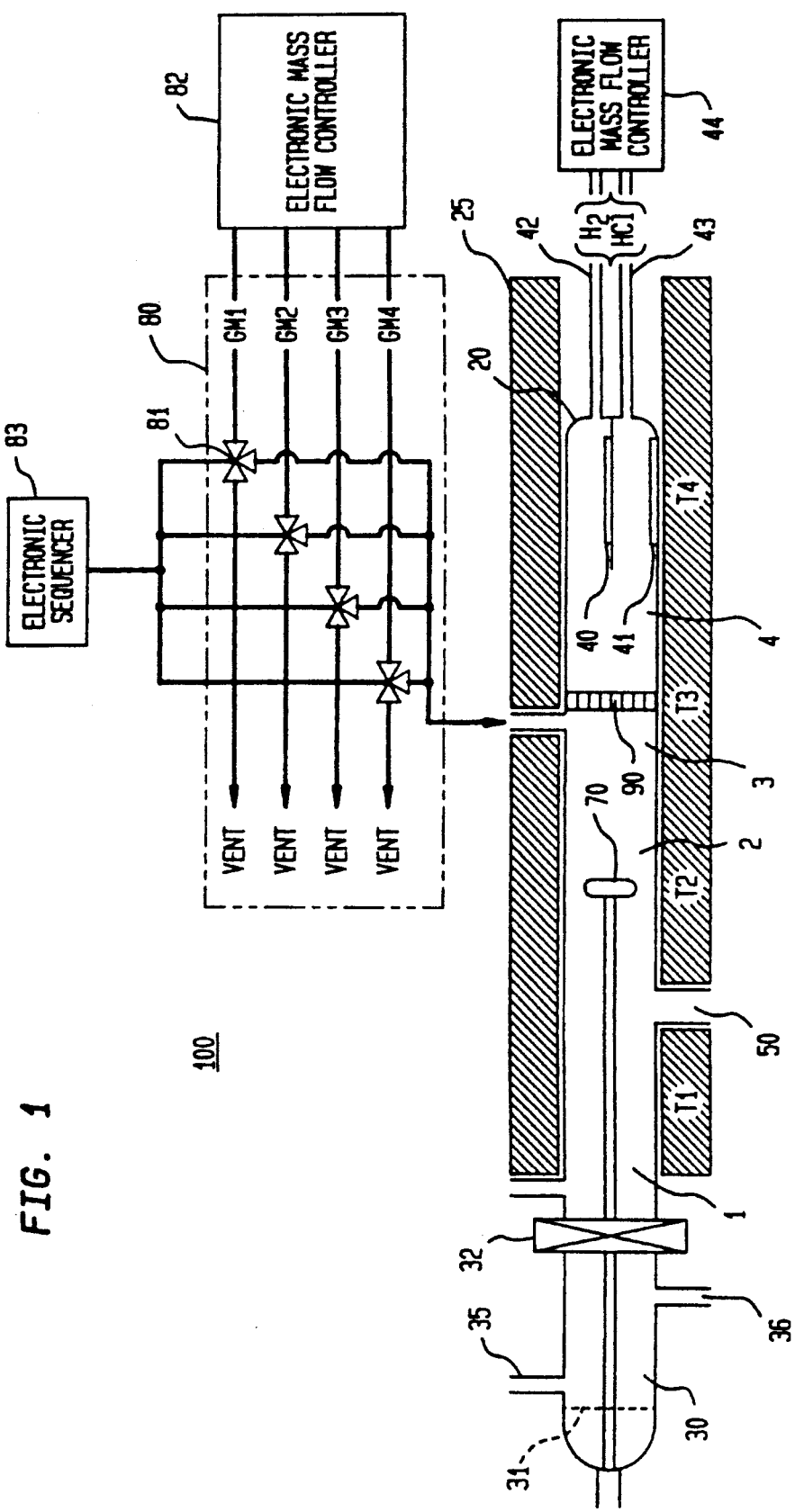
FIG. 1 is a cross-sectional illustration of a hydride VPE reactor employed in the present invention.

FIG. 1 is a cross-sectional illustration of a modified hydride VPE reactor employed by the present invention. As shown in FIG. 1, a fused silica or fused quartz reactor tube 20 is housed in a multiple temperature zone furnace 25. In addition to a loading chamber 30, four separate zones exist within the reactor 100. These zones are a preheat zone 1 at temperature T1, a deposition zone 2 at temperature T2, a mixing zone 3 at temperature T3, and a metal source zone 4 at temperature T4.

Loading zone 30 is attached to the reactor 100 and is separated into two pieces by a pneumatic gate valve 32. The two pieces are attached to the reactor by a ground joint 31. The outer piece contains an o-ring 33 which is sealed with a feed-through portion for the load rod 34 and the inner piece is fitted with an intake valve 35, which is secured to a hydrogen source (not shown), and with an exhaust 36. The intake valve 35 and exhaust 36 allow for the loading zone to be flushed with $H_2$ after loading the substrate 70 on the loading rod 34.

In operation, the substrate 70 is loaded in zone 30 and preheated in zone 1 to prepare the substrate for the deposition of the semiconductor heterostructure.

Figure 3:
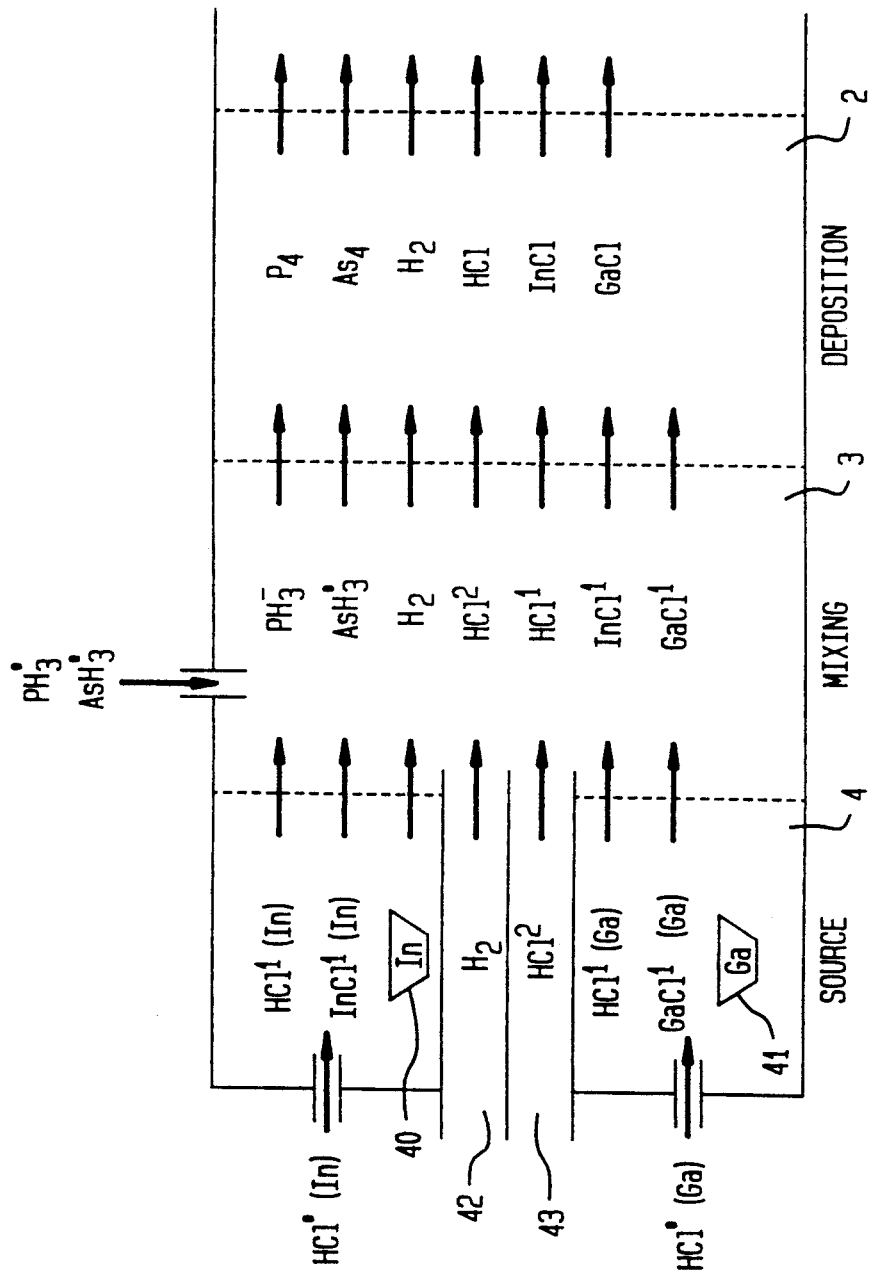
FIG. 3 is a chemical and thermodynamic model of the various reactions utilized in the present invention.

After the substrate 70 has been loaded and preheated, the primary metal reactants are prepared in the source zone 4 which has two separated chambers. As shown in FIG. 3, source chamber 40 contains liquid metallic indium and source chamber 41 contains liquid metallic gallium. Separate gas mixtures of hydrogen ($H_2$) and hydrogen chloride (HCl) gas are introduced into each chamber 40 and 41 by intake valves 42 and 43, respectively. In operation, these gases are controlled by standard electronic mass flow controllers (represented by block 44) which are attached to the intake valves 42 and 43. These electronic mass flow controllers are widely used in the art and therefore, need not be described further. When the HCl gas is introduced to the source chambers 40 and 41, it reacts with the liquid metals to form volatile metal chlorides and hydrogen as products. Typically, these flows are diluted with $H_2$ to approximately 10%. As a result of the introduction of $H_2$ and HCl, the HCl reacts with the source metals to form monochlorides of the metals at equilibrium. These chemical reactants and their respective products are shown in FIG. 3.

In mixing zone 3, anion reactant gas mixtures are injected and mixed with the metal chlorides formed in the source zone 4. Typically, these anion gas mixtures are arsine $AsH_2$ and/or phosphine $PH_3$ diluted in $H_2$. These reactants and their respective products formed with the metal chlorides from source zone 4 are also shown in FIG. 3. Other dopant gases such as hydrogen sulfide diluted in hydrogen may also be typically added at this point.

Epitaxial growth of the semiconductor layers, then, takes place in deposition zone 2. This zone is held at a temperature which is typically lower than that of the source and mixing zones 4 and 3, approximately 700° C.

The composition of the growing InGaAsP film can be altered while at the same time retaining its lattice-match to an InP or GaAs substrate by simultaneously injecting hydrogen chloride gas HCl and altering the $AsH_:/PH_:$ ratio flowing into the mixing zone of the reactor. In one embodiment of the invention, a gas switching manifold 80 has been added for this purpose. With the use of three-way pneumatic valves 81 in manifold 80, reactant anion gas mixtures GM1 and GM2 can be directed to flow alternately into either the reactor or a vent line. GM1 and GM2 consist of predetermined mixtures of arsine, phosphine, and hydrogen and are selected by electronic mass flow controllers (represented by block 82). GM3 is a mixture of H: and HCl. Gas mixture GM3, when injected into the reactor, increases the gallium (Ga) content and decreases the indium (In) content of the growing layer. Therefore, when GM3 and GM2 are vented rather than injected into the reactor furnace 25, GM1 can be directed into the furnace so as to deposit a layer of InGaAsP with a predetermined composition A. Alternatively, when GM3 and GM2 are co-injected into the reactor, GM1 can be directed to the vent so as to deposit a layer of InGaAsP with a predetermined composition B. Accordingly, the flow rates of HCl, $H_3$ and $AsH_3$ can be adjusted to produce compositions A and B so that they correspond to a lattice-matched condition with either an InP or GaAs substrate. The simultaneous switching of the gas flow can be accomplished using preprogrammed electronic sequencer (represented by block 44) for electro-pneumatic activation of the appropriate pneumatic valves 81.

As explained in an article published by the inventors herein and entitled, "Altering the Composition of InGaAsP Grown by the Hydride Technique by Introducing HCl Downstream," Journal of Electrochemical Society, Vol. 138, No. 5, May 1991, which is incorporated herein by reference, the addition of HCl reduces the supersaturation of the gaseous reactants, but does so to a different extent for each reactant. Specifically, HCl lowers the supersaturation of InCl more than it lowers the supersaturation of GaCl which results in a net increase in the Ga mole fraction in the material. Moreover, HCl is also known to reduce the growth rate of the film so that the deposition transitions can be controlled more easily. As a result, the lattice matching can be attained by simultaneously adjusting the arsine and phosphine flow rates to compensate for the increased Ga content of the material. Because growth of the layers will cease and etching will begin after a certain amount of HCl has been added, there are limits to the amount of change in the Ga concentrations that can be sustained utilizing the present invention. These limits are set forth in the article noted above.

Other embodiments of the present invention are also possible, for example, additional gas mixtures (GM4 shown in FIGS. 1 and 2) can be similarly added to introduce dopants (controlled impurities) into the reactor.

Moreover, a perforated baffle 90 may be added upstream from the source zone 4 and adjacent to the mixing zone inlet. This baffle is used to facilitate mixing and to reduce back-diffusion of reactants into the source zone 4. A consequence of this design is improved switching speed for more abrupt transitions between layer compositions. The baffle 90 may be constructed from a fused-silica plate with a distribution of holes approximately 2 mm in diameter, for example and may be readily fused to the reactor walls.

Further, to enhance the extent of the reaction of HCl with the liquid metal in the source zones, high purity fused-silica gas lines can also be used to feed or bubble the HCl directly into the liquid metal.

Figure 2:
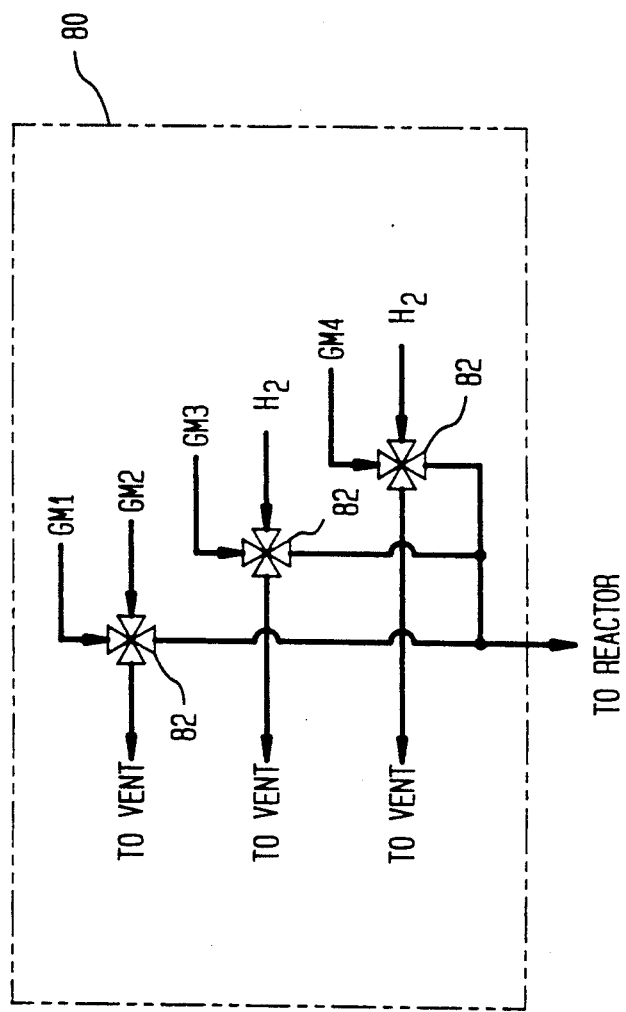
FIG. 2 is a diagram of an alternate switching manifold which may be used in an alternate embodiment of the present invention.

An alternate gas switching manifold design can also be constructed as shown in FIG. 2. This system uses commercially available 4-way switching valve assemblies with two inputs (GM1 and GM2) and two outputs. One output leads to the reactor and one leads to the vent. The valve assemblies operate such that one input gas is directed to the reactor while the other is directed to the vent, and vice-versa. An identical valve assembly can be used to select either HCl or $H_2$. With this arrangement, the total flow rate to the reactor can be kept constant before and after switching the flows thus, leading to greater system stability. Additional 4-way valve assemblies can be added for even further flexibility.

Furthermore, the exhaust lines can be connected to vacuum pumps thereby enabling the present invention to operate at reduced pressures. Reduced pressure will result in more uniform deposition and more abrupt changes in the composition of deposited films.

Accordingly, although the present invention has been described in relation to particular embodiments, many other variations and modifications and other uses will become apparent to those skilled in the art. Therefore, the present invention should not be construed to be limited by the specific disclosure herein, but only by the appended claims.

What is claimed is:

1. A hydride vapor phase epitaxy reactor comprising:
   loading means for loading a semiconductor substrate into a reactor furnace;
   source means for creating a flow of metal monochlorides;
   mixing means coupled to said source means for mixing predetermined anion reactant gas mixtures with said flow of metal monochlorides;
   deposition means connected to said loading means and said mixing means for exposing said substrate to the anion reactant gas mixtures and the flow of metal monochlorides; and
   means for introducing a predetermined amount of hydrogen gas and hydrogen chloride in said mixing means so as to alternatively increase the amount of III or V semiconductor material being deposited on said substrate thereby depositing alternating layers of predetermined semiconductor materials on said substrate.

2. The hydride vapor phase epitaxy reactor of claim 1 wherein said source means comprises at least two chambers, one chamber containing liquid metal indium and another chamber containing liquid metal gallium; and at least two intake valves with intake lines, one connected to a hydrogen gas source via an electronic mass flow controller and one connected to a hydrogen chloride source via said electronic mass flow controller such that hydrogen gas and hydrogen chloride may be selectively infused into said source means at predetermined amounts.

3. The hydride vapor phase epitaxy reactor of claim 2 wherein said intake lines are made of high purity fused silica and connect directly into the indium and gallium chambers such that the hydrogen gas and hydrogen chloride bubble through the liquid metal indium and gallium.

4. The hydride vapor phase epitaxy reactor of claim 1 wherein said mixing means comprises a chamber with an intake port, said chamber being coupled to said source means; and a manifold connected to said intake port, the manifold having at least two pneumatic valves which are coupled to sources of arsenine and phosphine via an electronic mass flow controller and an electronic sequencer such that the arsine and phosphine may be selectively infused into the chamber in predetermined amounts.

5. The hydride vapor phase epitaxy reactor of claim 1 wherein said means for introducing a predetermined amount of hydrogen gas and hydrogen chloride comprises a intake valve coupled to sources of hydrogen gas and hydrogen chloride.

6. The hydride vapor phase epitaxy reactor of claim 5 wherein said intake valve is incorporated within said manifold and coupled to said electronic mass flow controller and said electronic sequencer.

7. The hydride vapor phase epitaxy reactor of claim 6 wherein said intake valve is a three-way pneumatic valve and said at least two pneumatic valves are three-way pneumatic valves.

8. The hydride vapor phase epitaxy reactor of claim 7 wherein said mixing means further comprises vent connected to said three-way pneumatic valves such that the mixtures of arsine and phosphine can be selectively vented or infused into said chamber.

9. The hydride vapor phase reactor of claim 4 wherein said mixing means further comprises at least a third pneumatic valve connected to a source of dopant gases via said electronic mass flow controller.

10. The hydride vapor phase reactor of claim 1 further comprising a baffle connected to said source means and said mixing means.

11. The hydride vapor phase epitaxy reactor of claim 1 further comprising vacuum means for reducing the pressure within said reactor.

12. A hydride vapor phase epitaxy method comprising the steps of:
    loading a semiconductor substrate into a reactor furnace;
    creating a flow of metal monochlorides;
    mixing predetermined amounts of anion reactant gas mixtures with said flow of metal monochlorides;
    exposing said substrate to the anion reactant gas mixtures and the flow of metal monochlorides; and
    introducing a predetermined amount of hydrogen gas and hydrogen chloride in said mixing step so as to alternatively increase the amount of III or V semiconductor material being deposited on said substrate thereby depositing alternating layers of predetermined semiconductor materials on said substrate.

13. The hydride vapor phase epitaxy method of claim 12 wherein said flow of metal monochlorides consists of InCl and GaCl, said flow of metal monochlorides being created by exposing liquid metal indium and liquid metal gallium to predetermined amounts of hydrogen gas and hydrogen chloride.

14. The hydride vapor phase epitaxy method of claim 13 wherein the amounts of hydrogen chloride and hydrogen gas are controlled by an electronic mass flow controller.

15. The hydride vapor phase epitaxy method of claim 13 wherein hydrogen gas and hydrogen chloride are bubbled directly through the liquid metal indium and gallium through high purity fused silica lines.

16. The hydride vapor phase epitaxy method of claim 12 wherein said anion gas reactants are arsine and phosphine and are mixed with the flows of metal monochlorides via a manifold coupled to an electronic mass flow controller such that the arsine and phosphine are selectively infused into the chamber in predetermined amounts.

17. The hydride vapor phase epitaxy method of claim 16 wherein the predetermined amounts of hydrogen and hydrogen chloride are further introduced into the reactor via said manifold and are controlled by said electronic mass flow controller.

18. The hydride vapor phase epitaxy method of claim 16 wherein the amounts of arsine, phosphine, hydrogen gas and hydrogen chloride are selectively vented or infused into the reactor via three-way pneumatic valves in said manifold.

19. The hydride vapor phase method of claim 12 further comprising the step of introducing dopant gases to said flow of metal monochlorides.

20. The hydride vapor phase method of claim 12 further comprising the step of for reducing the pressure within said reactor.

* * * * *